United States Patent
Cerio, Jr.

(10) Patent No.: US 7,588,667 B2
(45) Date of Patent: Sep. 15, 2009

(54) DEPOSITING RHUTHENIUM FILMS USING IONIZED PHYSICAL VAPOR DEPOSITION (IPVD)

(75) Inventor: Frank M. Cerio, Jr., Schenectady, NY (US)

(73) Assignee: Tokyo Electron Limited, Tokyo (JP)

( * ) Notice: Subject to any disclaimer, the term of this patent is extended or adjusted under 35 U.S.C. 154(b) by 411 days.

(21) Appl. No.: 11/279,064

(22) Filed: Apr. 7, 2006

(65) Prior Publication Data
US 2007/0235321 A1 Oct. 11, 2007

(51) Int. Cl.
C23C 14/35 (2006.01)

(52) U.S. Cl. ............... 204/192.17; 204/192.12; 438/580; 438/650; 438/686; 438/687

(58) Field of Classification Search ............ 204/192.12, 204/192.17; 438/580, 650, 686, 687
See application file for complete search history.

(56) References Cited

U.S. PATENT DOCUMENTS

| | | | |
|---|---|---|---|
| 5,637,533 A * | 6/1997 | Choi | ............... 438/643 |
| 6,080,287 A | 6/2000 | Drewerey et al. | |
| 6,132,564 A | 10/2000 | Licata | |
| 6,197,165 B1 | 3/2001 | Drewery et al. | |
| 6,287,435 B1 | 9/2001 | Drewery et al. | |
| 2003/0022454 A1 * | 1/2003 | Wang et al. | ............... 438/381 |
| 2003/0034244 A1 | 2/2003 | Yasar et al. | |
| 2004/0188239 A1 | 9/2004 | Robison et al. | |

OTHER PUBLICATIONS

"Summary Abstract: Reactively sputtered RuO2 and MoO diffusion barriers", J. Vac. Sci. Technol. B 5 (6), Nov./Dec. 1987, pp. 1748-1749.*
U.S. Patent and Trademark Office, Search Report and Written Opinion, from corresponding PCT/US07/65756, dated Jul. 17, 2008.

* cited by examiner

Primary Examiner—Rodney G McDonald
(74) Attorney, Agent, or Firm—Wood, Herron & Evans, L.L.P.

(57) ABSTRACT

An iPVD system is programmed to deposit a barrier and/or seed layer using a Ru-containing material into high aspect ratio nano-size features on semiconductor substrates using a process which enhances the sidewall coverage compared to the field and bottom coverage(s) while minimizing or eliminating overhang within an IPVD processing chamber. In the preferred embodiment, an IPVD apparatus having a frusto-conical ruthenium target equipped with a high density ICP source is provided.

18 Claims, 5 Drawing Sheets

US 7,588,667 B2

DEPOSITING RHUTHENIUM FILMS USING IONIZED PHYSICAL VAPOR DEPOSITION (IPVD)

This application is related to commonly assigned and co-pending U.S. Patent Application Publication No. 20030034244, hereby expressly incorporated herein by reference.

FIELD OF THE INVENTION

The invention relates to the metallization of via and trench structures on semiconductor substrates. More particularly, the invention relates to the metallization of high aspect ratio via and trench structures of silicon substrates utilizing ionized sputtered materials to form Ruthenium (Ru) barrier and/or seed layers on the substrates.

BACKGROUND OF THE INVENTION

In the metallization of high aspect ratio vias and trenches on semiconductor substrates, it is required that the barrier and seed layer have good sidewall coverage.

Ionized PVD deposition is used for barrier and seed layer metallization in advanced IC wafers. Ionized PVD provides good sidewall and bottom coverage in via and trench structures. However, as the geometries shrink and as the via dimensions go down below 0.10 micrometers, ionized deposition requirements become more critical. Therefore, it is highly desirable to have an ionized PVD process where bottom and sidewall coverage are well balanced and overhang is minimized.

Accordingly, there is a need to further control step coverage of the metal or the overhang that typically develops during the deposition step.

SUMMARY OF THE INVENTION

According to embodiments of the present invention, a method of operating a deposition system to perform a Low Net Deposition (LND) or other low deposition rate process is provided that included positioning a patterned substrate on a substrate table within an IPVD processing chamber; depositing an ultra-thin barrier layer using a Ru-containing material having a high Oxygen concentration, wherein a Low Net Deposition (LND) process is used to produce the ultra-thin barrier layer for providing a barrier to copper (Cu) diffusion and providing a high etch resistant "etch stop" layer for subsequent deposition/etch processes; and removing the patterned substrate from the processing chamber.

According to certain embodiments of the present invention, a method is provided that includes depositing a barrier layer by: positioning a patterned substrate on a wafer table within a processing chamber of an IPVD apparatus having a frusto-conical ruthenium target therein; establishing within the processing chamber a pressure of at least 60 mTorr; inductively coupling a plasma into the chamber from an RF antenna at a power and frequency that will create a high density inductively coupled plasma (ICP) in the processing chamber; depositing an ultra-thin barrier layer containing ruthenium and oxygen at a low deposition rate; and removing the patterned substrate from the processing chamber.

BRIEF DESCRIPTION OF THE DRAWINGS

A more complete appreciation of various embodiments of the invention and many of the attendant advantages thereof will become readily apparent with reference to the following detailed description, particularly when considered in conjunction with the accompanying drawings, in which.

DETAILED DESCRIPTION OF SEVERAL EMBODIMENTS

Figure 1:
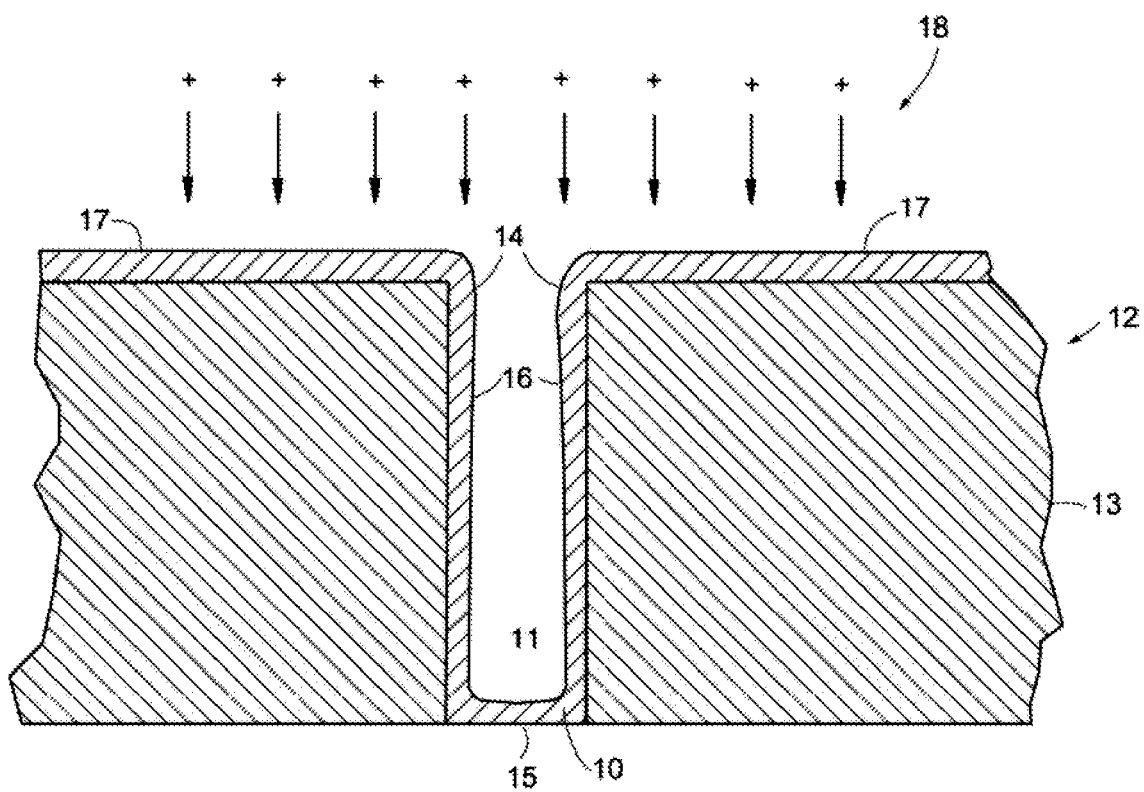
FIG. 1 illustrates a simplified view of a substrate cross-section in accordance with an embodiment of the invention.

A process is described in U.S. Patent Application Publication No. 20030034244 by Yasar et al., which is co-pending and assigned to the assignee of the present application, which provides ionized PVD with sequential deposition and etching. While with this type of sequencing the overhang or overburden are much improved over prior processes, some will still form during the deposition sequence and may not be entirely removed in the etch sequence.

Yasar et al. describe a technique to deposit and etch multiple times within a single vacuum chamber. Overhangs are not fundamentally controlled within the deposition step of this process. Higher bias powers are typically used in the deposition step to deposit as much bottom coverage as possible before etching back the bottom to redistribute material to the sidewalls and reduce the bottom coverage, which can add to line resistance. Reduction of overhang is achieved in the subsequent etch steps.

The invention provides a method of operating an ionized physical vapor deposition (iPVD) system to deposit barrier layer material into nano features on a patterned substrate on a substrate table within a processing chamber in the iPVD system. The method may be used, for example, to deposit a barrier layer using a Low Net Deposition (LND) iPVD process, wherein process parameters are adjusted to establish an ultra-low deposition rate in a field area of the patterned substrate. The method may also be used, for example, to repair a barrier.

The field area refers to the upper surface of the substrate being processed and is the surface into which the high aspect ratio vias and trenches extend. An ultra-low deposition rate as referred to herein as a deposition rate of less than about 15 nanometers per minute in the field area.

An iPVD processing system can be used for the barrier deposition processes. These processes can be typically performed in the vacuum processing chamber of an iPVD apparatus in which the substrate to be coated is held on a support. A high-density plasma is maintained in the chamber using a processing gas, which can be, for example, an inert gas into and metal ions. The high-density plasma is usually ionized by coupling RF energy into the process gas, often by an inductive coupling from outside of the chamber. The RF energy ionizes both the process gas and a fraction of the coating material, which may be to a low plasma potential of only a few volts, but may be higher. The processing gas and the ionized coating material can then be directed onto the substrate by control of the bias on the substrate, to coat and not etch the substrate. For the LND processes of the present invention, an iPVD process is run, but with the deposition rates reduced as explained in the examples below. The parameters of the IPVD process are controlled to produce the LND result on the plasma-facing surface of the substrate, or field area of the substrate. When so controlled, the iPVD process produces the desired result of deposition of a barrier layer or a seed layer, without producing overhangs around the feature openings.

Exemplary embodiments of the method of the invention are described below, which disclose a deposition technique for use with an iPVD system to metallize high aspect ratio vias and trenches by depositing ionized metal with a flux to the field area surface of the substrate that produces a flux to the sidewall of the feature. This technique does not rely on an etch sequence to control the conformality of the metal. The deposition process is such that the overhang or overburden is eliminated or minimized, reducing the reliance on or need for the etch step as an overhang control. In various embodiments, the process involves depositing an ultra-thin barrier and/or seed layer of a Ru-containing metal such as Ru or $RuO_2$. For example, a Ta-containing layer deposition process can be followed by a Ru-containing seed layer process and a dry-filling process may be used next in which a metal such as copper is deposited without using an electroplating process.

This invention is distinctly different from prior art which teaches high DC powers with high RF bias powers for increased conformality or the case where several deposition and etch steps are performed within or in different vacuum chambers. A Ruthenium deposition process can be characterized by very low deposition rates. For example, the DC power can be reduced to reduce the deposition rate to less than 10 nm/min. Additionally, a range of RF substrate biases can be applied to the substrate during the barrier deposition process.

FIG. 1 illustrates a simplified view of a substrate cross-section in accordance with an embodiment of the invention. In the illustrated embodiment, a via structure 11 is shown having a barrier and/or seed layer 10 deposited on the sidewalls 16 of the via structure, a barrier and/or seed layer 10 deposited on the bottom 15 of the via structure, and a barrier and/or seed layer 17 deposited on the top surface of the substrate. A modified iPVD process is used to deposit a barrier and/or seed layer 10 into via structure 11 formed in a dielectric interlayer 13 of a semiconductor substrate 12. As metal ions 18 are deposited onto the substrate 12, the metal deposition has a propensity to become thicker at the via entrance causing an overhang structure 14. The method of the invention can prevent or reduce the overhang structure. Similarly, the deposition of the barrier and/or seed layer at the bottom 15 of via 11 can become thicker than at the sidewalls 16. The method of the invention provides a substantially conformal deposition of barrier and/or seed layer material on the sidewalls and the bottom of the via.

In some embodiments, the barrier and/or seed layer can include Ru-containing material that can include compounds comprising Ruthenium (Ru), such as Ru and $RuO_2$. In other embodiments, the barrier and/or seed material can include compounds comprising $RuO_x$, where x can vary from zero to four. The thickness Ru-containing material can be controlled during an IPVD process to obtain the best performance with respect to etch resistance, copper diffusion, conformality, adhesion, or resistivity, or a combination thereof. In addition, the oxygen concentration in the processing chamber can be controlled during an IPVD process to obtain a Ru-containing layer having the best performance with respect to etch resistance, copper diffusion, conformality, adhesion, or resistivity, or a combination thereof. Alternatively, a Ta-containing material may be used as a barrier layer, and a Ru-containing material may be used as a seed layer. The Ta-containing material may include compounds comprising $TaN_y$, where y can vary from 0 to 1.5. In this IPVD process, the Tantalum-Nitrogen ratio and the thickness of the barrier layer may be controlled during an IPVD process to obtain the best performance with respect to etch resistance, copper diffusion, conformality, adhesion, and resistivity. For example, a Ta-containing film may be deposited before the Ru-containing layer is deposited to improve the adhesion properties between the Ru-containing layer and the dielectric material in the substrate. Alternatively, a different adhesion improving material may be used.

In various embodiments, one or more Ru-containing layers can be deposited into features having critical dimensions less than 50 nm. In addition, the via structure 11 can include substantially straight and/or tapered sidewalls. The inventor believes that the methods and apparatus of the present invention can be used to deposit Ru-containing barrier and/or seed layers at the 65 nm node, the 45 nm node, and the 32 nm node. In addition, the inventor believes that the methods and apparatus of the present invention can be used to deposit Ru-containing metallic gate structures at the 65 nm node, the 45 nm node, and the 32 nm node. Furthermore, the inventor believes that the methods and apparatus of the present invention can be used to deposit Ru-containing capacitor and/or resistor structures at the 65 nm node, the 45 nm node, and the 32 nm node. Alternatively, one or more Ru-containing barrier and/or seed layers may be deposited into trenches and/or vias in dual damascene features.

The inventor believes that the method and apparatus of the invention can be used to control the grain size in the ultra-thin Ru films. Thinner films may have more grain boundaries and therefore may have a higher resistivity. For example, the bulk resistivity of Ruthenium is approximately 7 micro-ohms cm, and the bulk resistivity of Ruthenium Oxide is approximately 35 micro-ohms cm. When ultra-thin metallic films are produced, metal islands can be formed, and the inventor believes that the IPVD system can be used to increase the surface mobility and improve the conformality of the deposited metal.

Figure 2A:
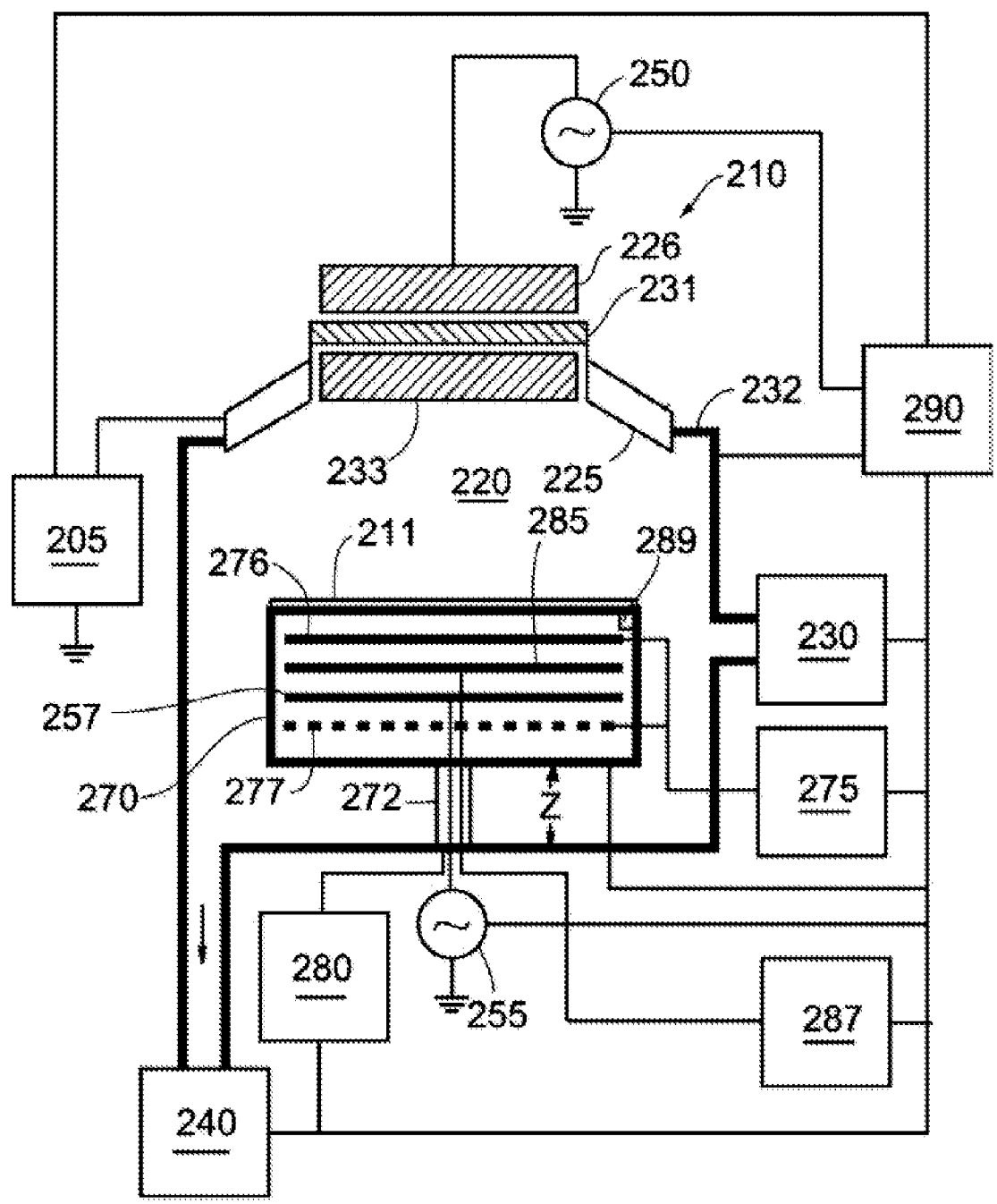
FIG. 2A illustrates an exemplary block diagram of a processing system according to an embodiment of the invention.

FIG. 2A illustrates an exemplary block diagram of a processing system according to an embodiment of the invention. In the illustrated embodiment, an iPVD system 200A is shown.

The IPVD system 200A can comprise an iPVD processing module 210, a DC source 205 coupled to a target 225 that is coupled to the processing chamber 220, a process gas supply system 230 that can be coupled to processing chamber 220, a pressure control system 240 that can be coupled to the processing chamber 220, a RF source 250 that can be coupled to the processing chamber 220, an RF bias generator 255 that can be coupled to an electrode 257 in the substrate holder 270, a backside gas supply system 280 that can be coupled to the substrate holder 270, and an ESC control unit 287 coupled to the ESC 285.

The IPVD system 200A comprises a controller 290 coupled to the processing chamber 220, coupled to the DC source 205, coupled to the gas supply system 230, coupled to the pressure control system 240, coupled to the RF source 250, coupled to the RF bias generator 255, coupled to the substrate holder 270, coupled to the thermal control system 275, coupled to the backside gas supply system 280, and coupled to the ESC control unit 287.

The IPVD processing module further comprises an antenna 226, a window 231 coupled to the antenna, a louvered deposition baffle 233 coupled to the window, a target 225 coupled to the processing chamber 220. RF power can be supplied to the antenna 226 from the RF generator 250, and can be used to create an inductively coupled plasma in the chamber 220.

The antenna 226 can be electrically connected using a RF matching network (not shown) to, and selectively energized or powered by, the RF generator 250. The RF generator 250 can provide a time-varying RF current at a frequency between about 100 kHz and about 100 MHz that is supplied to the antenna 226 at a power ranging between about 100 watts and about 10000 watts. For example, an operating frequency of approximately 13.56 MHz can be used. Alternately, other frequencies can be used. When energized by the RF generator 250, the antenna 226 radiates isotropic RF electromagnetic fields. A metallic outer enclosure or cage (not shown) can be used to surround the antenna to confine the radiated RF electromagnetic fields therein to ensure the safety of nearby persons and to prevent electromagnetic interference with surrounding electronics.

Examples of iPVD systems are described in U.S. Pat. Nos. 6,287,435; 6,080,287; 6,197,165 and 6,132,564, and these patents are hereby expressly incorporated herein by reference. The IPVD magnetron sputtering apparatus having a frusto-conical target with an external antenna coupling a high density ICP into the processing chamber is particularly useful for the described embodiments of the present invention.

In one embodiment, a controllable backside pressure can be established that allows the apparatus controller to set the relative influence of the backside pressure on the respective process steps differently, depending on the process parameters. This may include variable backside pressures or flexible duty cycles.

The antenna 226 can be positioned outside of the process chamber 220 behind a dielectric window 231 in the chamber wall 232. A louvered deposition baffle 233, preferably formed of a slotted metallic material, is located inside of the chamber 220 closely spaced from the window 231 to shield the window 231 from deposition. The controller 290 can be used to determine the amount of ICP power to provide and when to have it applied to the antenna. For example, ICP power from the RF generator 250 to the antenna 226 can be switched between different power levels during the different steps in a barrier deposition process.

The IPVD system 200A can also comprise a substrate holder 270 that can include an electrostatic chuck 285 and can be coupled to the processing chamber using a Z-motion drive 272. The Z-motion drive 272 can be used to adjust the substrate-to-source distance to provide the best deposition uniformity. The controller 290 can be used to determine the gap size required during the barrier deposition process and provide the control data to the Z-motion drive 272 when it is required. During a barrier and/or seed layer deposition process, the substrate-to-source distance can vary from approximately 150 mm to approximately 300 mm.

The substrate holder 270 can accommodate a 200 mm substrate, a 300 mm substrate, or a larger substrate. For example, substrate 211 can be transferred into and out of processing chamber 220 through an opening (not shown) that is controlled by a gate valve assembly (not shown). In addition, substrate 211 can be transferred on and off the substrate holder 270 using a robotic substrate transfer system (not shown). In addition, substrate 211 can be received by substrate lift pins (not shown) housed within substrate holder 270 and mechanically translated by devices housed therein. Once the substrate 211 is received from the transfer system, it can be lowered to an upper surface of the substrate holder 270.

During processing, a substrate 211 can be held in place on top of the substrate holder 270 using an electrostatic chuck 285. Alternately, other clamping means may be used.

In addition, the substrate temperature can be controlled when the substrate is on the substrate holder 270. The substrate holder can include a heater assembly 276 and a cooling assembly 277 that can be coupled to the temperature control system 275. The heater assembly 276 and the cooling assembly 277 can be used along with one or more backside gasses to establish the correct substrate temperature. The temperature of the substrate 211 can be controlled to obtain the best via metallization. The controller 290 can be used to determine and control the substrate temperature. For example, the cooling assembly 277 may include fluid passages (not shown) in the substrate holder 270 and the appropriate temperature controls.

The thermal conductivity between the substrate holder 270 and the substrate 211 can be controlled by providing backside gas between the substrate 211 and the substrate holder 270. Process parameters can be controlled during the barrier and/or seed layer process to ensure that the metal deposited in the via structures is uniform. For example, heat generated in the substrate 211 during plasma processing can be extracted efficiently by the substrate holder 270 to keep the temperature of the substrate 211 at a substantially constant temperature, or the heat can be used to increase the substrate temperature.

Gas channels (not shown) can be used to direct a backside (heat transfer) gas, such as helium or argon, between the top of the substrate holder 270 and the facing surface of the substrate 211. For example, a two-zone system may be used to establish different and independent backside pressure values for a center portion and an edge portion thereby providing a different thermal conductivity between the substrate holder and different portions of the substrate.

The backside gas can be used to control the transfer of heat energy between the substrate holder 270 and substrate 211 by providing an efficient heat transfer medium. The electrostatic chuck 285 can also be used to control the transfer of heat between the substrate 211 and substrate holder 270. For example, the electrostatic force can be made approximately uniform to cause a significant portion of the facing surface of the substrate 211 to physically contact the top surface of the substrate holder 270 and to contact the top surface of the substrate holder 270 with a substantially uniform force. The electrostatic force can also be controlled to limit the leakage of heat transfer gas from beneath the substrate 211 when the backside gas pressure changes, thereby maintaining a controlled backside gas pressure and providing the correct thermal conductivity between the substrate 211 and the substrate holder 270.

One or more temperature sensors 289 can be positioned at one or more locations on or within the substrate holder 270 and can be coupled to the controller 290 that converts signals from the temperature sensors 289 to provide an indication of the temperature of different portions of substrate holder 270. The temperature of the substrate holder 270 can be used to determine the temperature of the substrate 211 and the controller 290 can provide feedback information to the temperature control system 275 and the backside gas supply system 280 for regulating the temperature of substrate 211.

For example, the backside gas can be supplied at a pressure in a range from approximately zero Torr to approximately ten Torr, and the backside gas can apply a force to the substrate 211 due to the pressure differential between the backside gas pressure and the pressure within the vacuum processing chamber 220 which can vary during processing between about 5 mTorr and about 500 mTorr. The force applied by the backside gas acts to displace the substrate 211 from the substrate holder 270, and to counteract this force, a clamping voltage can be applied to the electrostatic chuck 285 to establish an attractive electrostatic force of a magnitude sufficient to secure the substrate 211 to the substrate holder 270.

RF bias power can be supplied to an electrode 257 in the substrate holder 270 using the RF bias generator 255, and can be used to provide a substrate bias. The controller 290 can be used to determine the amount of RF bias power to provide and when to have it applied to the substrate holder 270. For example, RF bias power can be turned on to a level appropriate during barrier and/or seed layer processes to control the bias on the substrate 211 to improve and affect the process.

The operating frequency for the RF bias generator 255 can range from 1 MHz to 100 MHz. The RF bias generator 255 can be used to selectively apply a bias potential that accelerates positively charged plasma components toward the substrate. The bias potential provided by the RF bias generator 255 substantially determines the kinetic energies of positive ions attracted to the substrate from the plasma. The RF bias generator 255 typically operates at a frequency of about 13.56 MHz and at a power between about 100 watts and about 1000 watts. Alternately, the RF bias generator 255 may be omitted from the processing system and the substrate holder may be either grounded or electrically floating. Alternately, other frequencies can be used, such as 2 MHz or 27 MHz.

Process gas can be provided to the processing chamber 220 by the gas supply system 230. During IPVD processes that are used to deposit a Ru-containing material, the gas supply system 230 can provide an inert gas and/or an oxygen-containing gas. During an IPVD process, the process gas flow rate can range from approximately zero sccm to approximately 1000 sccm. When an inert gas is used during an IPVD process, the inert gas can include argon, helium, krypton, radon, xenon, or a combination thereof, and the flow rates for the inert gas can range from approximately zero sccm to approximately 1000 sccm. When an oxygen-containing gas is used during an IPVD process, the oxygen-containing gas can comprise $O_2$, NO, $N_2O$, CO, $CO_2$, or $H_2O$ or a combination thereof, and the flow rate for the oxygen-containing gas can range from approximately zero sccm to approximately 1000 sccm.

In alternate embodiments, a nitrogen-containing gas may used during an IPVD process, and the flow rate for the nitrogen-containing gas can range from approximately 0 sccm to approximately 1000 sccm. The nitrogen-containing gas can comprise $N_2$, NO, $N_2O$, and $NH_3$.

Chamber pressure can be controlled using the pressure control system 240. In addition, process gas can be supplied into the vacuum processing chamber 220 by the gas supply system 230. The chamber pressure can be maintained at a low pressure by the pressure control system 240. The controller 290 can be used to control the pressure control system 240, and/or the gas supply system 230 and to control the chamber pressure accordingly.

DC power can be supplied from a power source 205 to the target 225. The controller 290 can be used to determine the amount of DC power to provide and when to have it applied to the target.

The controller 290 can be configured to provide control data to the system components and receive process and/or status data from the system components. In addition, the controller 290 may be coupled to another control system (not shown), and can exchange information with the other control system. For example, the controller 290 can comprise a microprocessor, a memory (e.g., volatile or non-volatile memory), and a digital I/O port capable of generating control voltages sufficient to communicate and activate inputs to the iPVD system 200A as well as monitor outputs from the IPVD system 200A. Moreover, the controller 290 can exchange information with the system components, and a program stored in the memory can be utilized to control the aforementioned components of an iPVD system 200A according to a process recipe. In addition, the controller 290 can be configured to analyze the process and/or status data, to compare the process and/or status data with desired process and/or status data, and to use the comparison to change a process and/or control a system component. In addition, the controller can be configured to analyze the process and/or status data, to compare the process and/or status data with historical process and/or status data, and to use the comparison to predict, prevent, and/or declare a fault.

Figure 2B:
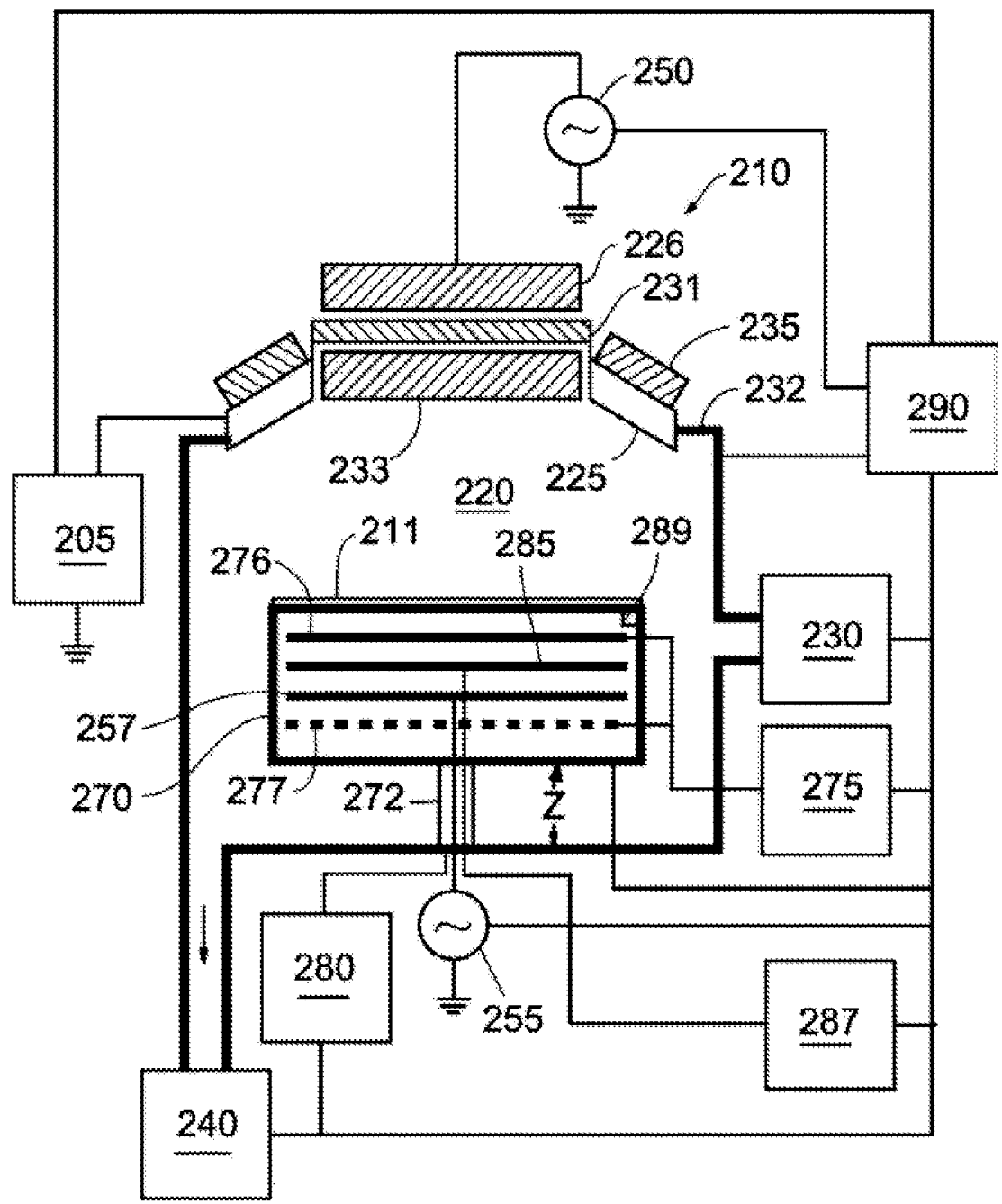
FIG. 2B illustrates an exemplary block diagram of a processing system according to an alternate embodiment of the invention.

FIG. 2B illustrates an exemplary block diagram of a processing system according to an alternate embodiment of the invention. In the illustrated embodiment, an IPVD system 200B is shown that can include the .IPVD system shown in FIG. 2A along with a magnet assembly 235 coupled to the processing chamber 200. The magnet assembly 235 may be used to shape the plasma within the processing chamber 200. Examples of apparatus having reduced and controllable magnetic fields are described in U.S. Pat. App. 20040188239, and this patent application is incorporated herein by reference.

As shown in FIG. 2B, a magnet assembly 235 can be located behind the target 225 and can be used to produce and/or change a static magnetic field shape in a process volume within the chamber. In some embodiments, a barrier and/or seed layer process can be performed using a magnet assembly 235 having a weak magnetic field strength. Field lines from the magnets can extend into the process volume. In alternate embodiments, these or other field lines present in the chamber may be caused to change to enhance the barrier and/or seed layer process. For example, magnetic fields may be changed by controlling the magnet configuration, by physically moving and/or rotating a magnet. In addition, an electromagnet or electromagnet component may be used to change a magnetic field. In addition, a local static magnetic field may be used to optimize the performance of the target.

Some magnet pack configurations for IPVD may typically produce static magnetic field strength at the target surface of over 150 Gauss or several hundred Gauss, to provide confinement of the plasma and a desired erosion profile and high target utilization. Reducing the static magnetic field strength at target surface to about 5-10 Gauss eliminates this confinement effect.

In various embodiments, one or more process parameters can be measured and compared with desired process parameters to control the operation of one or more components of the iPVD system. The measured performance can be used to alter one or more process parameters, such as a DC-on time, a shaping plasma process time, a DC-off time, a DC power, a backside pressure, substrate holder temperature, substrate temperature, etching rate, and/or deposition rate.

The controller 290 can be used to determine the amount of heat energy that the heater assembly 276 provides and when to have it provided to the substrate 211. The amount of heat energy can be changed between different levels during a barrier and/or seed layer process. In addition, the controller 290 can use the cooling element 277 to control the temperature of the substrate holder 270 and the substrate 211. For example, the thermal mass of the substrate holder 270 can be reduced and/or controlled to optimize its thermal response time. Furthermore, the thermal conductance between the substrate holder 270 and the substrate 211 can be controlled by providing backside gas between the substrate 211 and the substrate holder 270. The controller 290 can monitor and control the substrate temperature, the temperature of the substrate holder 270, the temperature control system 275, the backside gas system 280, and other process parameters during a barrier and/or seed layer process to ensure that the metal deposition within the features is substantially uniform. In addition, the performance of the electrostatic chuck 285 may be controlled to compensate for changes in the backside pressure.

Figure 3:
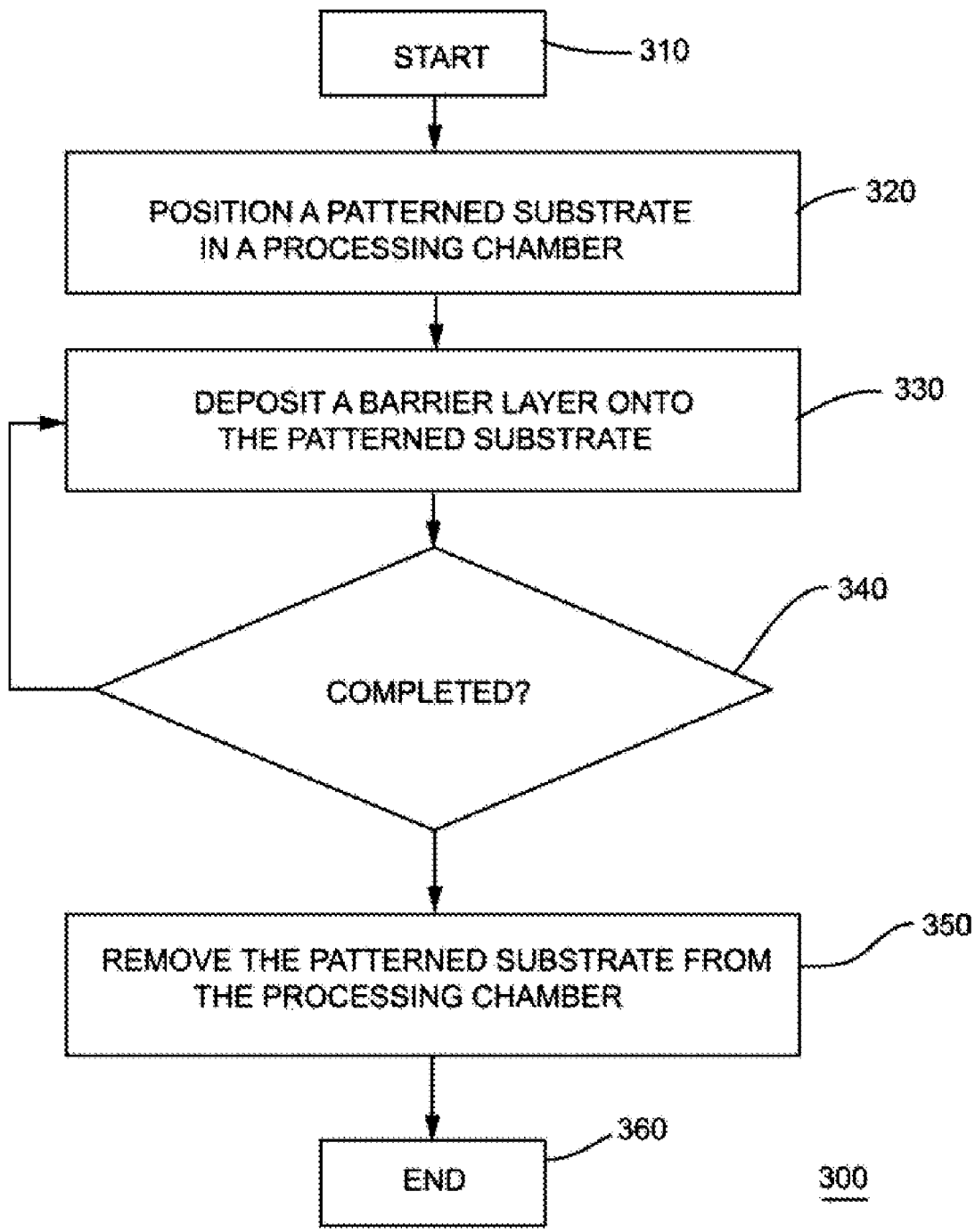
FIG. 3 illustrates a simplified flow diagram of a method of operating a deposition system to perform a barrier deposition process in accordance with an embodiment of the invention.

FIG. 3 illustrates a simplified flow diagram of a method of operating a deposition system to perform a process in accordance with an embodiment of the invention. In the illustrated embodiment, a more etch resistant TaN barrier layer id deposited using a LND process. In alternate embodiments, other procedures can be performed that may include one or more NND processes, one or more LND processes, and various combinations of LND processes and NND processes. Procedure 300 starts in 310.

In 320, a patterned substrate/wafer can be positioned on a substrate table in a processing chamber as described herein. Alternately, a non-patterned substrate/wafer may be used. For example, the processing chamber can be an iPVD chamber. In one embodiment, the substrate table can be vertically translated to establish the required gap (240 mm) between the target and the substrate. Alternately, the gap can be established at a different time or the gap may be dynamically changed during the process. The gap size can range from approximately 150 mm to 300 mm. For example, the gap can range from approximately 200 mm to 270 mm.

The chamber pressure can be lower to value between approximately 50 mTorr and approximately 150 mTorr. For example, barrier and/or seed layer processes that use Ru-containing material may be performed between approximately 60 mTorr and approximately 100 mTorr.

In 330, a deposition process can be performed. In various embodiments, a Ru-containing barrier and/or seed layer can be deposited, and a LND process can be performed to deposit a substantially conformal barrier and/or seed layer that has improved etch resistance, improved adhesion properties, or better copper diffusion barrier properties, or a combination thereof. For example, annealing experiments/tests may be performed to verify the improved performance.

In one embodiment, ICP power can be provided to an antenna coupled to the processing chamber during the barrier and/or seed layer process. In an alternate embodiment, a different configuration may be used as a plasma source, and an antenna may not be required. The ICP source can be an RF generator, and the ICP source can operate in a frequency range from approximately 1.0 MHz to approximately 100 MHz. For example, the ICP source can be operated at approximately 13.56 MHz. The ICP power can range from approximately 2000 w to approximately 10000 w. For example, the ICP power can range from approximately 4700 w to approximately 5700 w.

The processing system can also comprise a gas supply system that is coupled to the processing chamber, and the gas supply system can be used to flow process gas into the processing chamber during one or more parts of the barrier and/or seed layer process. The process gas can comprise an inert gas, or an oxygen-containing gas, or a combination thereof. In some embodiments, the processing gas can be pulsed.

In addition, when Argon gas is used during a barrier and/or seed layer process, the flow rates for the Argon gas can range from 200 sccm to 1000 sccm. For example, an Argon gas flow rate that is less than approximately 500 sccm may be used during some barrier and/or seed layer processes.

The processing system can also comprise a metallic target, and the metallic target can be used to provide a source of metal ions. A DC power source can be coupled to the metallic target. In various embodiments, the DC power can range from approximately 100 watts to approximately 3000 watts during a barrier and/or seed layer process. For example, an upper limit for the DC power level can be established to prevent target poisoning.

In a preferred embodiment, the IPVD system can be used to perform a number of deposition processes, and the IPVD system can use a Ru-containing target to perform one or more deposition processes. For example, the target can include Ruthenium and/or Ruthenium Oxide. Alternatively, the IPVD system may be configured for a number of different targets that can include tantalum (Ta), titanium, (Ti), cobalt (Co), iridium (Ir), aluminum (Al), silver (Ag), lead (Pt), or copper (Cu), or a combination thereof. For example, metal ions can diffuse towards the substrate surface based on the bias power, and can be affected by a self-bias voltage within a plasma sheath, which is the potential difference between the potential of the plasma and the potential at the substrate surface.

The metallic target can be used to provide a source of metal ions, and the metal ions can diffuse towards the substrate surface based on the on bias power, and can be affected by a self-bias voltage within a plasma sheath, which is the potential difference between the potential of the plasma and the potential at the substrate surface.

Using the apparatus and method of the present invention, a $RuO_2$ barrier and/or seed layer can be deposited using different oxygen concentrations during the process. The process is stable and metal mode can still be maintained with a higher N concentration in the film.

Using the apparatus and method of the present invention, oxygen or oxygen-containing gases can be introduced to reactively sputter a Ru oxide as an interfacial layer that has better adhesion and/or barrier properties. In another embodiment, an ultra-thin Ru layer can be deposited and subsequently annealed in-situ or ex-situ in an oxygen environment to oxidize the film. The oxygen-containing gas process steps can be performed one or more times and the steps can include reactive and/or oxidation processes.

In addition, certain embodiments can be configured to have either a reduced strength static magnetic field in vicinity of the target surface or with no static cathode magnetic field. A weak magnet configuration may be used to maintain the static magnetic field shape and orientation so that the field within the target area and the nearby plasma generates an optimal erosion profile for high target utilization. Such low or reduced field strength can be maintained constant in the barrier and/or seed layer processes, or may be changed to a different level during the barrier and/or seed layer process. For example, a controllable magnetic field may be used to provide a weak or zero static magnetic field, for example less than 10 Gauss, in the process volume. Furthermore, a controllable magnetic field may be used to reduce and/or reshape the magnetic field to adjust the field uniformity across the target surface.

In one embodiment, a process and an apparatus are provided wherein the simultaneous control of the target power and the RF substrate bias power is used a provide a process that causes a LND in the field area of the substrate. For example, a process can be provided that involves depositing a thin layer of metallization, for example, Ruthenium (Ru), ruthenium nitride ($Ru_xN_y$) and/or ruthenium oxide (RuO) into features of the substrate.

Furthermore, during the LND processing time, a chamber pressure, a chamber temperature, a substrate temperature, a process gas chemistry, a process gas flow rate, a gap size, an ICP power, substrate position, a target power, and a RF substrate bias power can be adjusted to establish and/or maintain the required LND deposition rate. As the LND process is performed material can be deposited into features of the patterned substrate while producing substantially no overhanging material at openings of the features and a low net deposition in the field area of the substrate.

When depositing ultra-thin films that include a Ru-containing material, the barrier and/or seed layer process can include a deposition rate that can have a field deposition rate component, a sidewall deposition rate component, and a bottom surface deposition rate component that can be different. When a LND process is being performed, the field deposition rate component can range from approximately 0 nm/min to approximately +15 nm/min; the sidewall deposition rate component can vary from approximately 20% to approximately 100% of the field deposition rate component; and the bottom surface deposition rate component can vary from approximately 20% to approximately 100% of the field deposition rate component. Alternatively, a No Net Deposition (NND) process can be performed and when a NND process is being performed, the field deposition rate component can range from approximately −10 nm/min to approximately +15 nm/min; the sidewall deposition rate component can vary from approximately 20% to approximately 100% of the field deposition rate component; and the bottom surface deposition rate component can vary from approximately 20% to approximately 100% of the field deposition rate component. In an alternate embodiment, a NND process may be used to create a punch through in at least one feature of the patterned substrate.

During a LND process, a deposition time period may be used to add material on the field area on the top surface of the substrate and a shaping (DC-off) time may be used to remove an amount of material on the field area on the top surface of the substrate, and thus there is a low net deposition at the end of the process cycle on the field area on the top surface of the substrate. In addition, during the NND process, the deposition component may add material on the bottom and/or side surfaces of features on the substrate and the etching (sputtering) component may remove a lesser amount of material on the bottom and/or side surfaces of features on the substrate, and thus there is a net deposition at the end of the process cycle on the bottom and/or side surfaces of features on the substrate. The deposition/etch cycle can be repeated as many times as needed to achieve the desired result. By adjusting the DC level and the RF substrate bias levels, voids in the deposited material can be eliminated, and the overhang can be eliminated and/or minimized.

During a filling process, a sputtering component can be used to remove some of the excess material from the via bottom and from the overhangs. When the metal layer is copper, the etch process increases the continuity of the Cu on the bottom and top portions of the feature sidewalls by redeposition of Cu sputtered from the via bottom and from the overhang at the via entrance. If the metal being etched is a barrier layer, the decrease in the thickness at the via bottom reduces the overall contact resistance of the via and improves device performance.

In 340, a query is performed to determine when the process has been completed. When the process has been completed, procedure 300 continues to 350, and when the process has not been completed, procedure 300 branches back to 330, and procedure 300 continues as shown in FIG. 3. For example, one or more of the LND deposition processes may be performed one or more times.

For example, after a certain desired amount of deposition, the DC power to the target and the RF substrate bias can be simultaneously turned off to substantially stop the deposition process. Those skilled in this art will realize that the deposition process can be substantially reduced and/or stopped by reducing the DC power level to a very low level without completely turning it off. When multiple cycles are performed the process parameters can remain constant, or alternatively one or process parameters can change during different cycles.

In 350, the processed substrate can be removed from the processing chamber. In some embodiments, one or more cleaning processes may be performed after a processed substrate is removed from the processing chamber. For example, target cleaning processes may be performed before and/or after a deposition process is performed. In addition, chamber cleaning processes may be performed before and/or after a deposition process to remove contaminants from the processing chamber. For example, "wafer-less" cleaning steps may be performed after a wafer is processed and/or after a wafer lot is processed. Alternatively, test and/or dummy substrates may be used during cleaning processes. The process gas system can provide the process gasses required during a cleaning process. During cleaning steps, the chamber temperature can be increased and a oxygen-containing gas, such as CO, can be used.

Procedure 300 can end in 360.

In some cases, the substrate can be removed from the processing chamber and measured in another chamber. For example, an optical metrology tool can be used. In addition, Scanning Electron Microscope (SEM) data and/or TEM data can be used. In some embodiments, a repair procedure may be performed if the measured data indicates an incomplete deposition was performed or if the process data indicates an incomplete deposition was performed.

Measurement data can be obtained during a process and used to determine when to stop the process. Measurement data can include chamber pressure data, chamber temperature data, substrate temperature data, process gas chemistry data, process gas flow rate data, target material data, ICP power data, substrate position data, target power data, RF substrate bias power data, processing time data, process recipe data, or a combination thereof.

A processing time may be used to determine when to stop a process. Alternately, thickness data can be used to determine when to stop a process.

Timing can be controlled so that the target power is provided and/or changed at the correct setpoints in the process recipe. For example, the target power can be controlled to eliminate voids.

The apparatus and methods of the invention can be used to produce an ultra-thin substantially amorphous barrier having excellent etch resistance properties, excellent Copper diffusion properties, without damaging the underlying ultra-low-k layers or poisoning the target. The apparatus and methods of the invention provide a wide stable process window in which an IPVD process is performed using a "non-poison" metal mode).

Figure 4:
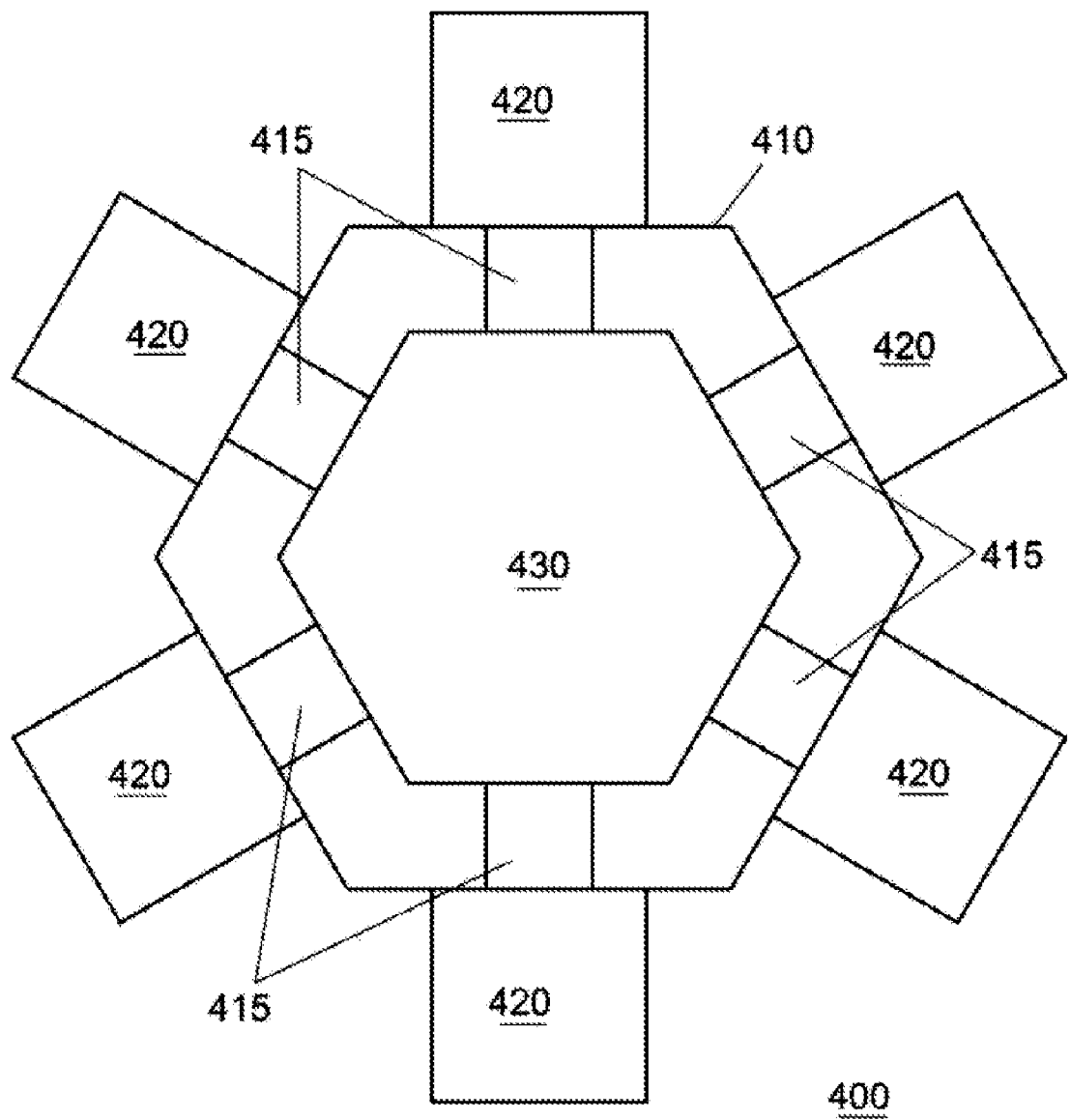
FIG. 4 illustrates a simplified block diagram of a processing system in accordance with embodiments of the invention.

FIG. 4 illustrates a simplified block diagram of a processing system in accordance with embodiments of the invention. In the illustrated embodiment, a processing system 400 having a cluster configuration is shown, but this is not required for the invention. Alternatively, other configuration may be used.

Processing system 400 can include a number of modules 420 coupled to a frame 410. Alternatively, a different number of modules and/or cluster may be used. Processing system 400 can include a transferring system 430 that can be couple to the modules 420 using a number of load lock modules 415. Alternatively, one or more of the load lock modules may not be required. For example, transferring system may include one or more robots (not shown) for transferring and/or storing substrates, and alignment systems (not shown) for aligning substrates.

The modules 420 can include one or more IPVD systems, one or more atomic layer deposition ALD systems, one or more plasma-enhanced atomic layer deposition PEALD systems, one or more chemical vapor deposition CVD systems, one or more plasma-enhanced chemical vapor deposition PECVD one or more thermal processing systems, one or more measurement systems, one or more loading systems, or one or more thermal processing systems, or combinations thereof.

In some embodiments, a patterned substrate can be transferred into the processing system 400, and an alignment and/or measurement process can be performed to measure the features of the patterned substrate. For example, one of the modules 420 can include an optical metrology system, and one or more substrates in a lot can be measured using the optical metrology system. Alternatively, an alignment and/or measurement process may not be required. Next, a Ta-containing barrier layer could be deposited on the patterned substrate. In one example, one of the modules 420 can include an ALD system, and one or more Ta-containing barrier layers can be deposited on the patterned substrate using an ALD process. In another example, one of the modules 420 can include a PEALD system, and one or more Ta-containing barrier layers can be deposited on the patterned substrate using a PEALD process. In an additional example, one of the modules 420 can include an IPVD system, and one or more Ta-containing barrier layers can be deposited on the patterned substrate using an IPVD process. Then, a Ru-containing seed layer could be deposited on top of the barrier layer. In one example, one of the modules 420 can include an ALD system, and one or more Ru-containing seed layers can be deposited on top of the barrier layer using an ALD process. In another example, one of the modules 420 can include a PEALD system, and one or more Ru-containing seed layers can be deposited on top of the barrier layer using a PEALD process. In an additional example, one of the modules 420 can include an IPVD system, and one or more Ru-containing seed layers can be deposited on top of the barrier layer using an IPVD process. Further processing can include a copper seed and/or a copper dry-filling process that can be performed using an IPVD process. Alternatively, a copper seed and/or a copper dry-filling process may not be required. In other alternate embodiments, an electroplating or an "electro-less" process can be used to fill the features on the substrate with copper.

In other embodiments, a patterned substrate can be transferred into the processing system 400, and an alignment and/or measurement process can be performed to measure the features of the patterned substrate. For example, one of the modules 420 can include an optical metrology system, and one or more substrates in a lot can be measured using the optical metrology system. Alternatively, an alignment and/or measurement process may not be required. Next, a Ru-containing barrier/seed layer could be deposited on the patterned substrate. In one example, one of the modules 420 can include an ALD system, and one or more Ru-containing barrier/seed layers can be deposited on the patterned substrate using an ALD process. In another example, one of the modules 420 can include a PEALD system, and one or more Ru-containing barrier/seed layers can be deposited on the patterned substrate using a PEALD process. In a preferred example, one of the modules 420 can include an IPVD system, and one or more Ru-containing barrier/seed layers can be deposited on the patterned substrate using an IPVD process. Further processing can include a copper seed and/or a copper dry-filling process that can be performed using an IPVD process. Alternatively, a copper seed and/or a copper dry-filling process may not be required. In other alternate embodiments, an electroplating or an "electro-less" process can be used to fill the features on the substrate with copper.

The inventor believes that a low deposition rate process will be required to produce a hard Ru-containing layer having the best Cu barrier film properties. In addition, the inventor believes that a higher pressure as well as a higher Oxygen concentration will be needed to increase the barrier property of the film.

The apparatus and methods of the invention provide a wide process window for depositing Ru-containing films. For example, the processing time window is expected to vary from approximately 10 seconds to approximately 300 seconds, and multiple cycles can be performed to obtain a graded or uniform layer. The chamber pressure can vary from approximately 5 mTorr to approximately 100 mTorr, the ICP power can vary from approximately 1000 watts to approximately 6000 watts; the target power can vary from approximately 0 watts DC to approximately 3000 watts DC; the substrate bias power can vary from approximately 0 watts to approximately 1000 watts; the flow rate for an inert gas can vary from approximately 0 sccm to approximately 1000 sccm; the flow rate for an oxygen-containing gas can vary from approximately 0 sccm to approximately 500 sccm; the gap size between the substrate and the target can vary from approximately 150 mm to approximately 300 mm; the substrate temperature can vary from approximately −30° C. to approximately 250° C.; the field deposition rate can vary from approximately 5 nm/min to approximately 50 nm/min; the bottom coverage (BC) deposition rate can be a percentage of the field deposition rate and the BC percentage can vary from approximately 5% to approximately 50%; the sidewall coverage (SC) deposition rate can be a percentage of the field deposition rate and the SC percentage can vary from approximately 5% to approximately 50%.

An excellent copper (Cu) barrier can be provided with a very thin Ru-containing film (<4 nm), and an excellent moisture and/or oxidation barrier can be provided with a very thin Ru-containing film (<4 nm). Furthermore, the Ru-containing films deposited using IPVD processes can have amorphous and/or nano-crystalline film properties.

The invention provides a method of depositing an ultra-thin Ru-containing barrier and/or seed layers using a variable Oxygen concentration to produce a Ruthenium Oxide layer for providing a barrier to copper (Cu) diffusion, and during the deposition process, the DC target operates in non-poison or metal mode to provide target voltage stability, deposition rate stability, and improved process stability.

The invention provides a method for controlling the film stoichiometry of Ru-containing films on the sidewalls of ultra-small high aspect ratio features. The invention provides a large process window for depositing amorphous films, and uses low target power while operating in a non-poisoning mode. The invention provides methods for producing Ru-containing barrier and/or seed layers having excellent oxidation/copper diffusion barrier properties by using high pressure (>50 mT) and low DC power (<3000 watts) to produce barrier layers that have various film stoichiometries and various resistivities.

The invention provides a method and apparatus for depositing Ru-containing barrier and/or seed layers having low resistivity (<20 micro-ohms cm) and having very low amounts of impurities such as hydrogen and carbon.

Furthermore, the invention provides a method of using an IPVD system to deposit an ultra-thin Ru-containing layers with amorphous or nano-crystalline film properties that provide better barrier properties than can be obtained using ALD or CVD processes.

In the metallization of high aspect ratio via holes and trenches on semiconductor substrates, it is required that the barrier layer and the seed layer have good sidewall and bottom coverage. The barrier layer needs to be as thin as possible without sacrificing its barrier properties. The barrier layer must be thin because its electrical resistance, which adds to the electrical resistance of the via structure, must be minimized. It needs to be conformal and continuous to prevent diffusion of seed layer material into the dielectric layer and into other layers to prevent reliability problems. This requires that the barrier layer thickness must be well controlled and minimized especially at the bottom of the via. A thick barrier layer at the bottom of the via may add substantial undesirable electrical resistance to the resistance of interconnect metallization.

In the LND barrier deposition process, metal can be sputtered off the target at a low rate. This results in only a minor dilution of the process gas ion plasma. The metal ionizes and is deposited on the substrate with a rate that can be less than 10 nm/min. A low bias is applied to the substrate to attract the ions to the bottom of the feature. Because of the low field deposition rate and the low bias, the metal deposits with little or no overhang developing. The sidewall coverage is enhanced, and the result is a highly conformal metal deposition, ideal for a barrier metal.

Within the LND processing window, the inventor believes that the interlayer dielectric and/or the pre-metalized surface will not be damaged because the substrate bias can be controlled.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

What is claimed is:

1. A method of operating an Ionized Physical Vapor Deposition (IPVD) system to deposit a barrier layer, the method comprising:
    positioning a patterned substrate on a substrate table within an IPVD processing chamber, the substrate having features including a field area, a sidewall, and a bottom surface;
    depositing an ultra-thin barrier layer using a ruthenium (Ru) and oxygen-containing material, the ultra-thin barrier layer being less than about 4 nm thick on the sidewall, wherein a Low Net Deposition (LND) process is used to produce the ultra-thin barrier layer for providing a barrier to copper (Cu) diffusion and providing a high etch resistant "etch stop" layer for subsequent deposition/etch processes, the LND process includes depositing material onto the field area at a deposition rate of not less than 5 nm/min and not more than 50 nanometers per minute (nm/min) while depositing or etching material, or a combination thereof, on the sidewall or the bottom surface, or a combination thereof and thereby producing substantially no overhanging material at feature openings; and
    removing the patterned substrate from the processing chamber.

2. The method as claimed in claim 1, wherein depositing the ultra-thin barrier layer further comprises:
    establishing a first pressure within the processing chamber, wherein the first pressure is between approximately 5 mTorr and approximately 100 mTorr;
    flowing a first process gas into the processing chamber at a first flow rate, the IPVD system comprising a gas supply system coupled to the processing chamber, wherein the first process gas comprises an inert gas and the first rate is between approximately 10 sccm and approximately 1000 sccm;
    providing a first inductively coupled plasma (ICP) power level to an antenna coupled to the processing chamber during a first deposition time; the IPVD system further comprising an ICP source coupled to the antenna, the ICP source operating at a first ICP power and at a first ICP frequency, the first ICP power creating a high density plasma;
    providing a first target power to a Ruthenium (Ru) target positioned within the processing chamber during a first processing time, wherein the IPVD system further comprises a target power source coupled to the target, the first target power being between approximately 100 watts and approximately 3000 watts;
    providing a first RF substrate bias power to the substrate table in the processing chamber during the first processing time, wherein the IPVD system further comprises an RF bias generator coupled to an electrode in the substrate table;
    flowing a second process gas into the processing chamber at a second flow rate, the IPVD system comprising a gas supply system coupled to the processing chamber, wherein the second process gas comprises an oxygen-containing gas; and
    exposing the patterned substrate to the high-density plasma during a first LND processing time.

3. The method as claimed in claim 2, wherein the first ICP frequency varies from 1 MHz to 100 MHz.

4. The method as claimed in claim 2, wherein the first ICP power level is greater than approximately 2000 watts and less than approximately 10000 watts.

5. The method as claimed in claim 2, wherein the first RF substrate bias power is equal to or greater than approximately zero watts and less than approximately 400 watts.

6. The method as claimed in claim 2, wherein the first target power is greater than approximately 300 watts and less than approximately 2000 watts.

7. The method as claimed in claim 2, wherein a first LND deposition rate is established during the first LND processing time, the first LND deposition rate comprising a first LND field deposition rate, a first LND sidewall deposition rate, or a first LND bottom surface deposition rate, or a combination thereof, said deposition rates including one or more of the following:
    a) the first LND sidewall deposition rate being in the range of from approximately −2 nm/min to approximately +10 nm/min;
    b) the first LND sidewall deposition rate being in the range of from approximately −1 nm/min to approximately +5 nm/min;
    c) the first LND bottom surface deposition rate being in the range of from approximately −2 nm/min to approximately +10 nm/min;

d) the first LND bottom surface deposition rate being in the range of from approximately −1 nm/min to approximately +5 nm/min; and e) the IPVD system further comprises a magnet assembly coupled to the target for producing a magnetic field proximate the target.

8. The method as claimed in claim 2, wherein the inert gas comprises argon (Ar), helium (He), krypton (Kr), radon (Rn), or xenon (Xe), or a combination thereof.

9. The method as claimed in claim 2, wherein the second flow rate is determined using a percentage of a total flow rate, the total flow rate including the first flow rate and the second flow rate, and the percentage being between approximately zero percent and approximately one hundred percent.

10. The method as claimed in claim 2, wherein the LND process is repeated N1 times, wherein N1 is an integer between one and five.

11. The method as claimed in claim 2, wherein the oxygen-containing gas comprises $O_2$, NO, $N_2O$, CO, $CO_2$, or $H_2O$ or a combination thereof.

12. The method as claimed in claim 2, wherein the second flow rate is established at a value of approximately zero sccm during a portion of the LND process.

13. The method as claimed in claim 2, wherein the second flow rate is pulsed between a first value and a second value during a portion of the LND process.

14. The method as claimed in claim 1, wherein the LND process is used to repair a barrier layer.

15. The method as claimed in claim 1, wherein the ultra-thin barrier layer comprises a specific resistivity that is less than 400 microohms-$cm^3$.

16. A method of depositing a barrier layer comprising:
positioning a patterned substrate on a wafer table within a processing chamber of an ionized physical vapor deposition (IPVD) apparatus having a frusto-conical ruthenium (Ru) target therein, the substrate having features including a field area, a sidewall, and a bottom surface;
establishing within the processing chamber a pressure of at least 60 mTorr;
inductively coupling a plasma into the chamber from an RF antenna at a power and frequency that will create a high density inductively coupled plasma (ICP) in the processing chamber;
depositing an ultra-thin barrier layer containing ruthenium and oxygen at a low deposition rate, the ultra-thin barrier layer being less than about 4 nm thick on the sidewall and the low deposition rate not exceeding 15 nanometers per minute (nm/min) and not less than −10 nm/min while depositing or etching material, or a combination thereof, on the sidewall or the bottom surface, or a combination thereof and thereby producing substantially no overhanging material at feature openings; and
removing the patterned substrate from the processing chamber.

17. The method as claimed in claim 16, wherein depositing the ultra-thin baffler layer further comprises:
establishing a first pressure within the processing chamber, wherein the first pressure is between approximately 60 mTorr and approximately 100 mTorr;
flowing a first process gas into the processing chamber at a first flow rate, the deposition system comprising a gas supply system coupled to the processing chamber, wherein the first process gas comprises an inert gas and the first rate is between approximately 10 sccm and approximately 1000 sccm;
providing a first ICP power level to an antenna coupled to the processing chamber during a first deposition time; the deposition system further comprising an ICP source coupled to the antenna, the ICP source operating at a first ICP power and at a first ICP frequency, the first ICP power creating a high density plasma;
providing a first target power to the target positioned within the processing chamber during a first processing time, wherein the IPVD system further comprises a target power source coupled to the target, the first target power being between approximately 100 watts and approximately 3000 watts;
providing a first RF substrate bias power to the substrate table in the processing chamber during the first processing time, wherein the IPVD system further comprises an RF bias generator coupled to an electrode in the substrate table;
flowing a second process gas into the processing chamber at a second flow rate, the IPVD system comprising a gas supply system coupled to the processing chamber, wherein the second process gas comprises an oxygen-containing gas; and
exposing the patterned substrate to the high-density plasma during a first LND processing time.

18. The method as claimed in claim 16, wherein the IPVD system further comprises a magnet assembly coupled to the processing chamber for producing a magnetic field within the processing chamber.

* * * * *

UNITED STATES PATENT AND TRADEMARK OFFICE
CERTIFICATE OF CORRECTION

| | | |
|---|---|---|
| PATENT NO. | : 7,588,667 B2 | Page 1 of 1 |
| APPLICATION NO. | : 11/279064 | |
| DATED | : September 15, 2009 | |
| INVENTOR(S) | : Frank M. Cerio, Jr. | |

It is certified that error appears in the above-identified patent and that said Letters Patent is hereby corrected as shown below:

In Column 2, line 51, "referred to herein as a deposition rate" should read --referred to herein is a deposition rate--.
In Column 2, lines 58-59, "an inert gas into and metal ions." should read --an inert gas, and metal ions.--.

In Column 3, line 57, "The thickness RU-containing material" should read --The thickness of RU-containing material--.

In Column 7, lines 43-44, "gas may used during" should read --gas may be used during--.

In Column 9, lines 13-14, "layer id deposited using" should read --layer is deposited using--.

In Column 10, line 24, "based on the on bias power" should read --based on the bias power--.

In Column 12, line 9, "one or process parameters can" should read --one or more process parameters can--.
In Column 12, line 58, "mode)." should read --mode.--.

In Column 13, line 13, "PECVD one or more thermal" should read --PECVD, one or more thermal--.

Signed and Sealed this

Eighth Day of June, 2010

David J. Kappos
*Director of the United States Patent and Trademark Office*

UNITED STATES PATENT AND TRADEMARK OFFICE
CERTIFICATE OF CORRECTION

PATENT NO. : 7,588,667 B2  
APPLICATION NO. : 11/279064  
DATED : September 15, 2009  
INVENTOR(S) : Frank M. Cerio, Jr.

Page 1 of 2

It is certified that error appears in the above-identified patent and that said Letters Patent is hereby corrected as shown below:

Title Page, (*) Notice: Subject to any disclaimer, the term of this patent is extended or adjusted under 35 U.S.C. 154(b) by 411 days.

should read (*) Notice: Subject to any disclaimer, the term of this patent is extended or adjusted under 35 U.S.C. 154(b) by 572 days.

In Column 2, line 51, "referred to herein as a deposition rate" should read --referred to herein is a deposition rate--.
In Column 2, lines 58-59, "an inert gas into and metal ions." should read --an inert gas, and metal ions.--.

In Column 3, line 57, "The thickness RU-containing material" should read --The thickness of RU-containing material--.

In Column 7, lines 43-44, "gas may used during" should read --gas may be used during--.

In Column 9, lines 13-14, "layer id deposited using" should read --layer is deposited using--.

In Column 10, line 24, "based on the on bias power" should read --based on the bias power--.

In Column 12, line 9, "one or process parameters can" should read --one or more process parameters can--.
In Column 12, line 58, "mode)." should read --mode.--.

In Column 13, line 13, "PECVD one or more thermal" should read --PECVD, one or more thermal--.

This certificate supersedes the Certificate of Correction issued June 8, 2010.

Signed and Sealed this

Third Day of August, 2010

David J. Kappos
*Director of the United States Patent and Trademark Office*

CERTIFICATE OF CORRECTION (continued)
U.S. Pat. No. 7,588,667 B2

In Column 15, line 4, "an ultra-thin RU-containing layers" should read --an ultra-thin RU-containing layer--.

In Claim 17, Column 18, line 9, "the ultra-thin baffler layer" should read --the ultra-thin barrier layer--.